(12) United States Patent
Harr et al.

(10) Patent No.: US 10,211,149 B2
(45) Date of Patent: Feb. 19, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Kyoung Moo Harr, Suwon-si (KR); Kyung Seob Oh, Suwon-si (KR); Hyoung Joon Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/710,374

(22) Filed: Sep. 20, 2017

(65) Prior Publication Data

US 2018/0240751 A1 Aug. 23, 2018

(30) Foreign Application Priority Data

Feb. 21, 2017 (KR) .......................... 10-2017-0023063

(51) Int. Cl.
*H01L 23/528* (2006.01)
*H01L 23/522* (2006.01)
(Continued)

(52) U.S. Cl.
CPC ...... *H01L 23/5226* (2013.01); *H01L 23/3171* (2013.01); *H01L 23/562* (2013.01);
(Continued)

(58) Field of Classification Search
CPC .................................................. H01L 23/528
(Continued)

(56) References Cited

U.S. PATENT DOCUMENTS 8,084,871 B2 12/2011 Rahim et al.
9,853,003 B1* 12/2017 Han ..................... H01L 23/645
(Continued)

FOREIGN PATENT DOCUMENTS

JP S62-193623 A 8/1987
JP 2001-284819 A 10/2001
(Continued)

OTHER PUBLICATIONS

Office Action issued in corresponding Korean Patent Application No. 10-2017-0023063, dated Nov. 13, 2018.

*Primary Examiner* — Mark Prenty
(74) *Attorney, Agent, or Firm* — McDermott Will & Emery LLP

(57) ABSTRACT

A fan-out semiconductor package includes: a semiconductor chip; an encapsulant encapsulating at least portions of the semiconductor chip; and a first connection member disposed on an active surface of the semiconductor chip and including a redistribution layer electrically connected to the connection pads of the semiconductor chip. The redistribution layer includes a line pattern having a first line portion having a first line width and a second line portion connected to the first line portion and having a second line width, greater than the first line width, a fan-in region is a projected surface of the semiconductor chip projected in a direction perpendicular to the active surface, a fan-out region is a region surrounding the fan-in region, and the second line portion at least passes through a boundary between the fan-in region and the fan-out region.

20 Claims, 10 Drawing Sheets

(51) Int. Cl.
*H01L 23/31* (2006.01)
*H01L 23/00* (2006.01)

(52) U.S. Cl.
CPC ...... *H01L 24/13* (2013.01); *H01L 2224/0401* (2013.01); *H01L 2224/06131* (2013.01)

(58) Field of Classification Search
USPC ........................................................ 257/775
See application file for complete search history.

(56) References Cited

U.S. PATENT DOCUMENTS

| | | |
|---|---|---|
| 2006/0220261 A1 | 10/2006 | Egawa |
| 2008/0157341 A1 | 7/2008 | Yang et al. |
| 2012/0013021 A1 | 1/2012 | Kobayashi et al. |
| 2015/0348877 A1 | 12/2015 | Huang et al. |
| 2016/0190058 A1 | 6/2016 | Takeda |
| 2016/0233189 A1 | 8/2016 | Shimote et al. |

FOREIGN PATENT DOCUMENTS

| | | |
|---|---|---|
| JP | 2012-039090 A | 2/2012 |
| KR | 10-2013-0132163 A | 12/2013 |

\* cited by examiner

FAN-OUT SEMICONDUCTOR PACKAGE

CROSS-REFERENCE TO RELATED APPLICATION(S)

This application claims benefit of priority to Korean Patent Application No. 10-2017-0023063 filed on Feb. 21, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package of which board level reliability is excellent.

According to an aspect of the present disclosure, a fan-out semiconductor package may be provided, in which a redistribution layer in a region in which board level reliability stress of the fan-out semiconductor package is concentrated is enhanced.

According to an aspect of the present disclosure, a fan-out semiconductor package may include: a semiconductor chip having an active surface having connection pads disposed thereon and an inactive surface opposing the active surface; an encapsulant encapsulating at least portions of the semiconductor chip; and a first connection member disposed on the active surface of the semiconductor chip and including a redistribution layer electrically connected to the connection pads of the semiconductor chip. The redistribution layer includes a line pattern having a first line portion having a first line width and a second line portion connected to the first line portion and having a second line width, greater than the first line width, a fan-in region is a projected surface of the semiconductor chip projected in a direction perpendicular to the active surface, a fan-out region is a region surrounding the fan-in region and the second line portion at least passes through a boundary between the fan-in region and the fan-out region.

According to another aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the semiconductor chip; and a second connection member disposed on the first connection member and the active surface of the semiconductor chip and including a redistribution layer electrically connected to the connection pads of the semiconductor chip. The redistribution layer includes a line pattern having a first line portion having a first line width and a second line portion connected to the first line portion and having a second line width, greater than the first line width, region R1 is a projected surface of the semiconductor chip projected in a direction perpendicular to the active surface of the semiconductor chip onto one plane region in which the redistribution layer of the second connection member is formed, region R2 is a projected surface of the first connection member projected in the direction perpendicular to the active surface of the semiconductor chip onto the one plane region, region R3 is a projected surface of a portion of the through-hole between the semiconductor chip and the second connection member projected in the direction perpendicular to the active surface of the semiconductor chip onto the one plane region, and at least portions of the second line portion of the line pattern overlap region R3.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to a direction opposite to the direction toward a mounting surface. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
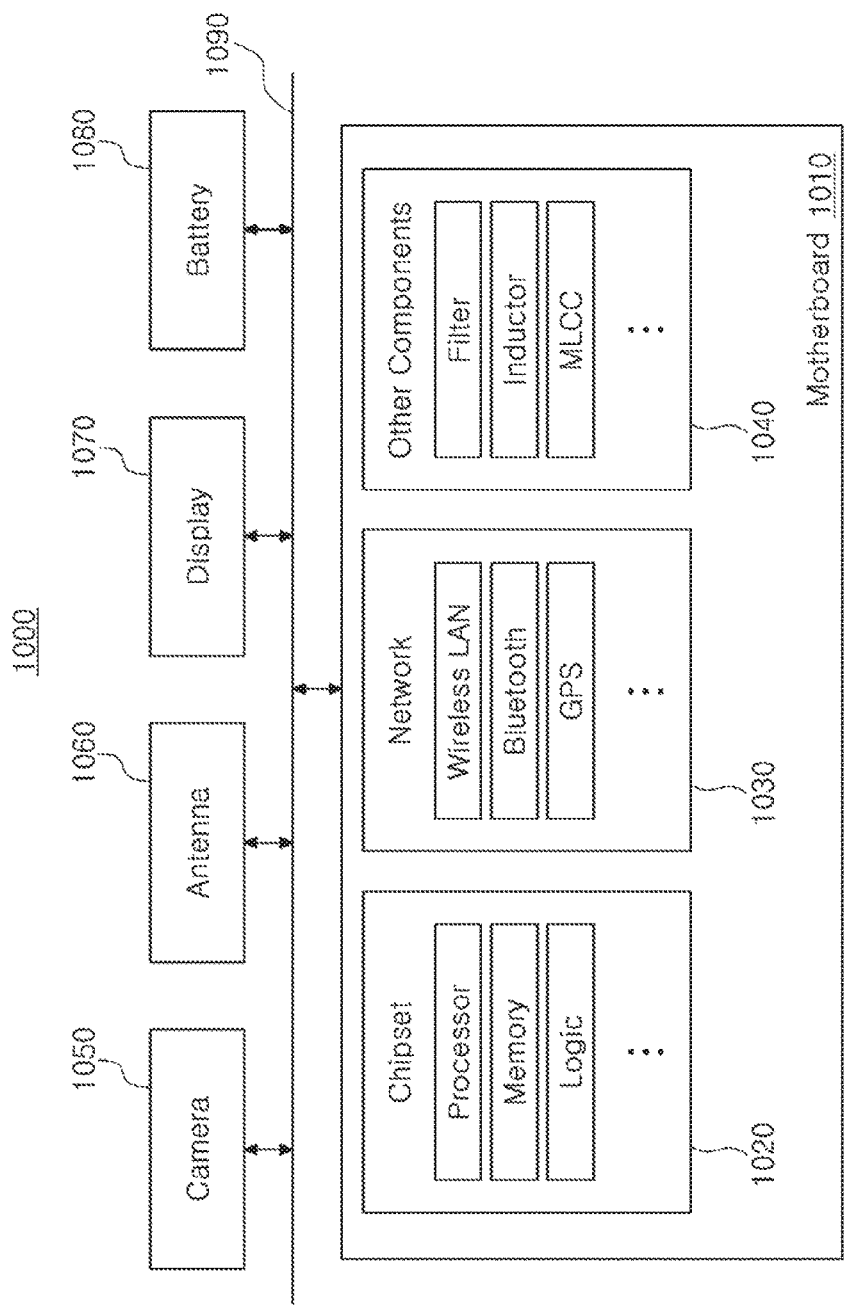
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
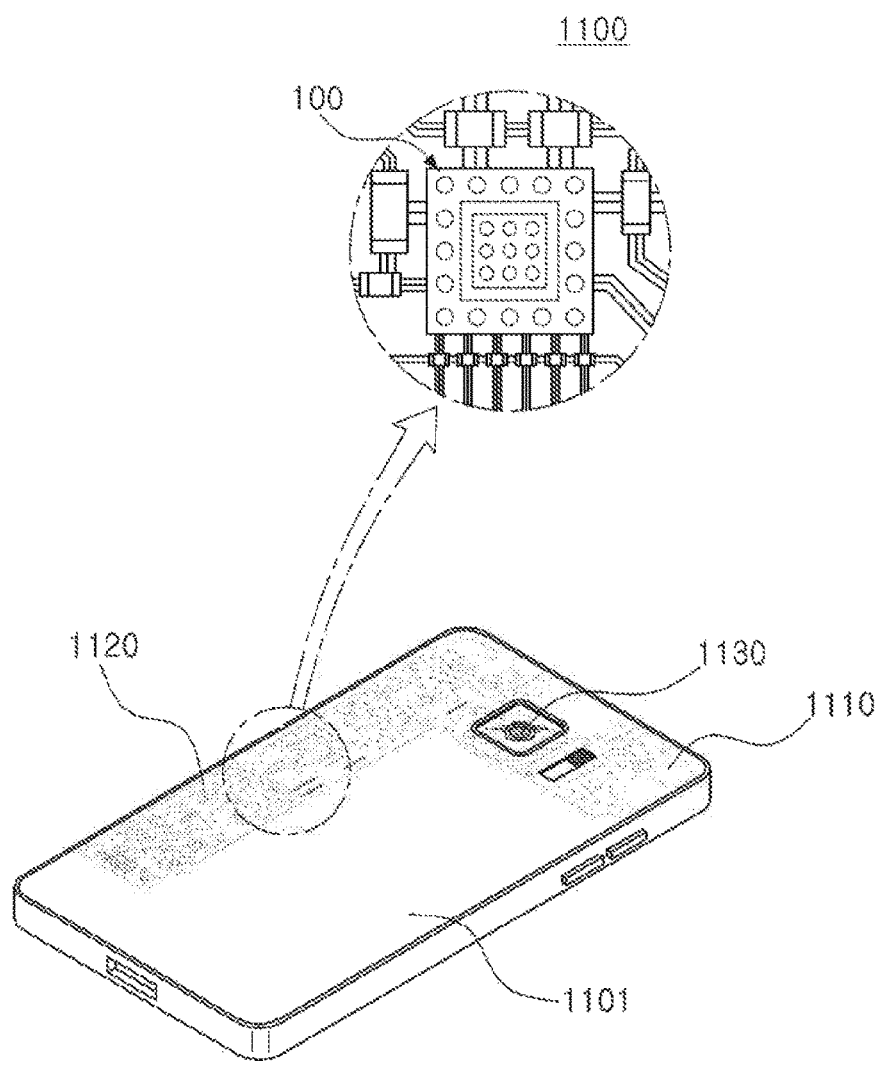
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
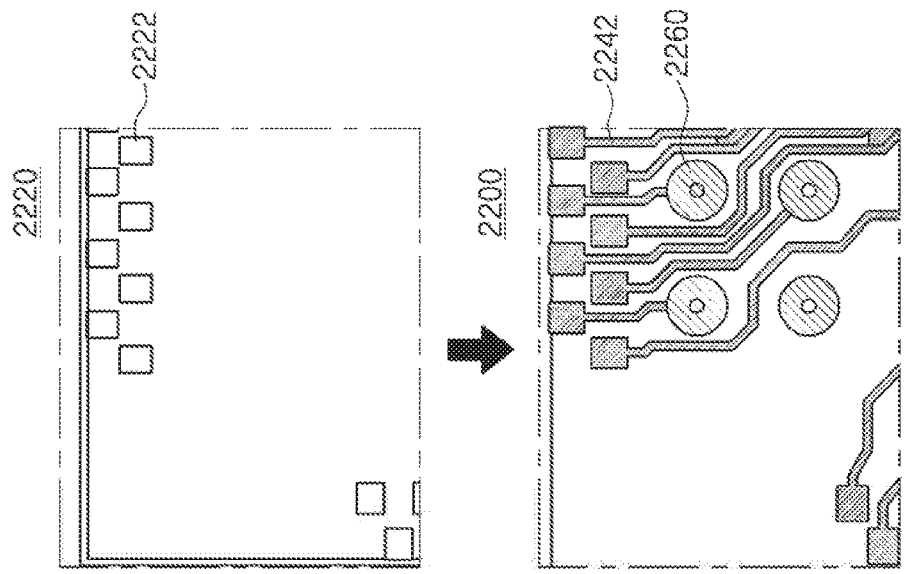
FIGS. 3A and 3B are schematic cross-sectional views illustrating states of a fan-in semiconductor package before and after being packaged.
Figure 3A:
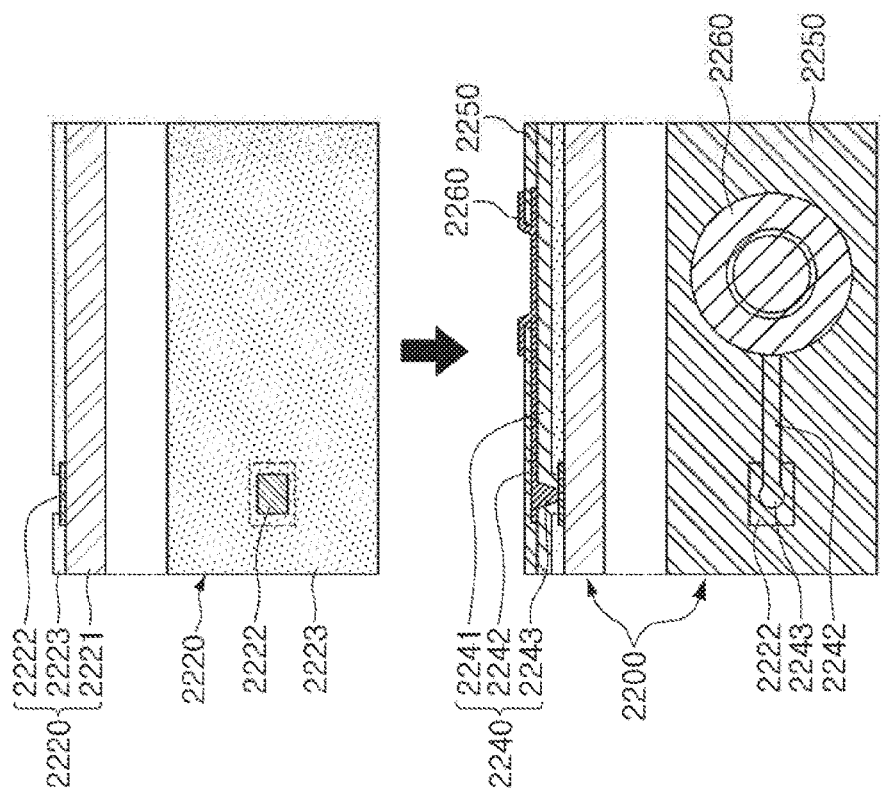

FIGS. 3A and 3B are schematic cross-sectional views illustrating states of a fan-in semiconductor package before and after being packaged.

Figure 4:
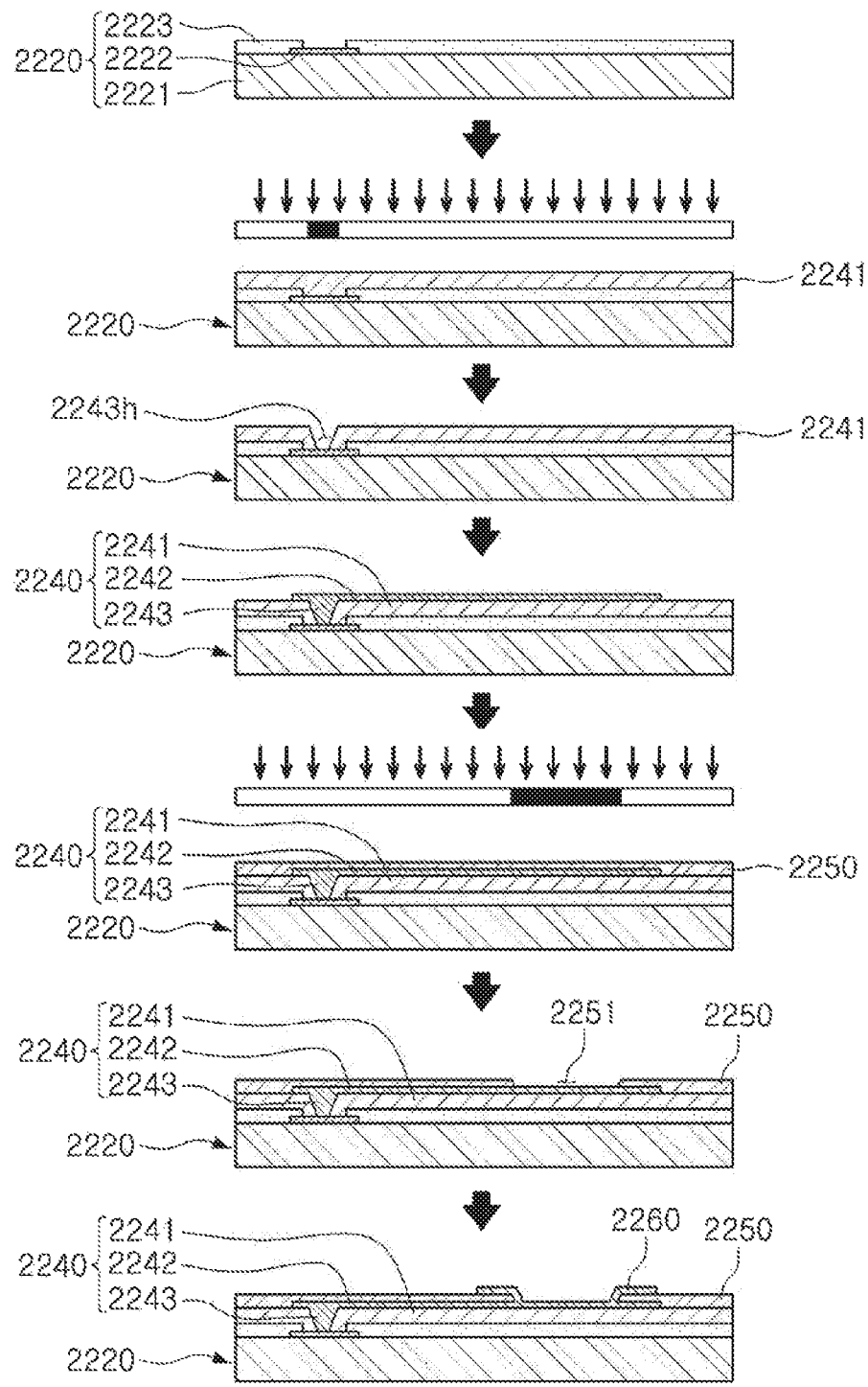
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
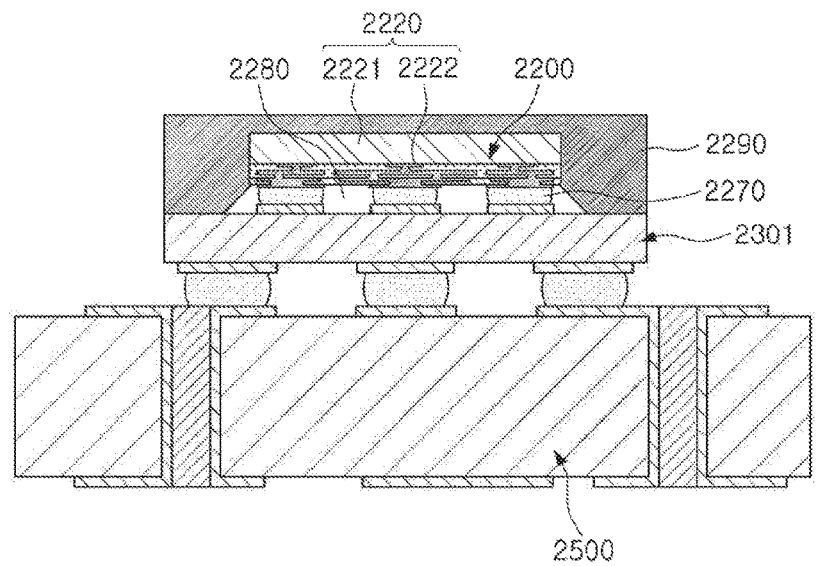
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
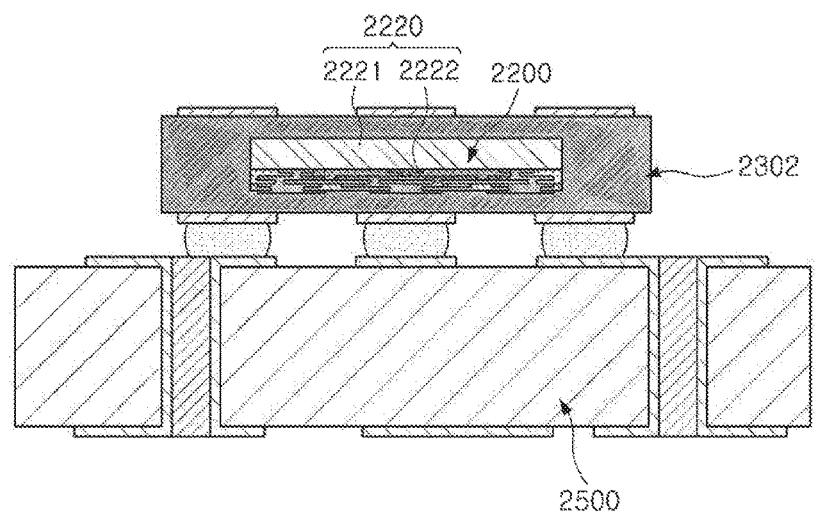
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
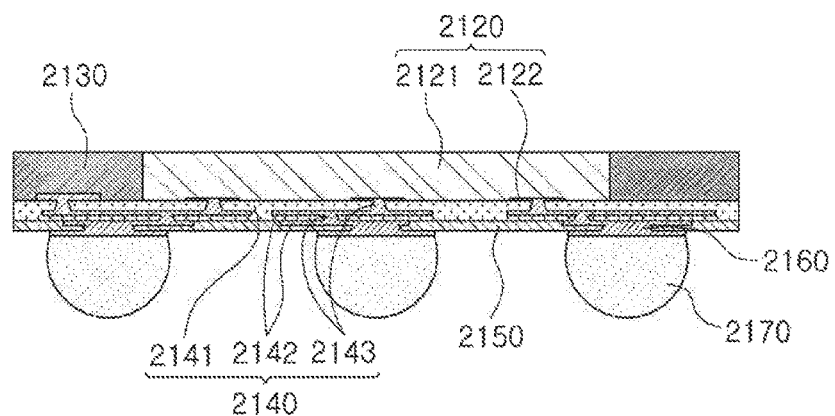
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
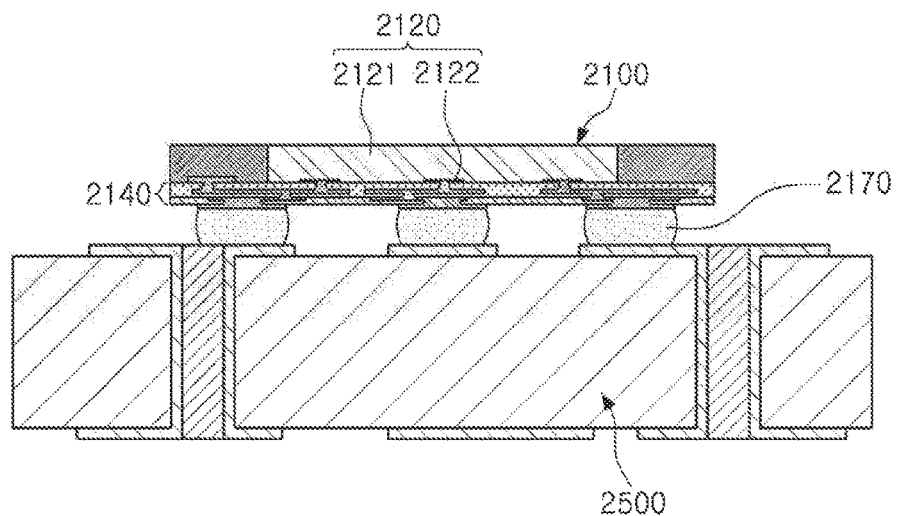
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package of which board level reliability is excellent will hereinafter be described with reference to the drawings.

Figure 9:
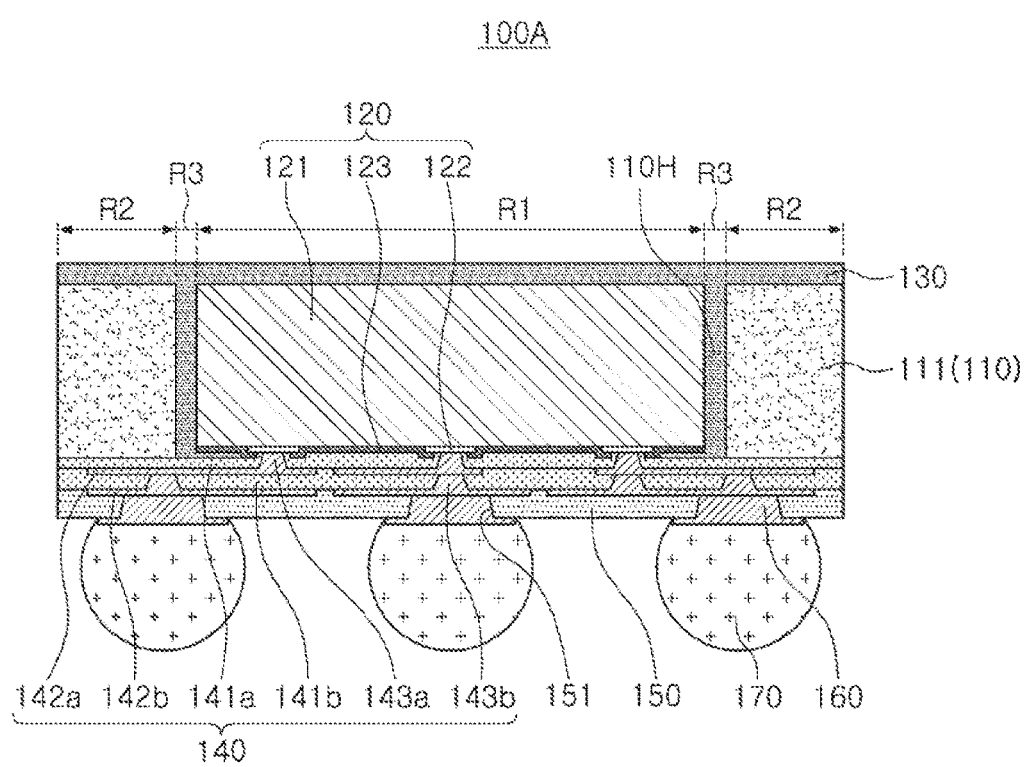
FIG. 9 is a schematic cross-sectional view illustrating an example of a fan-out semiconductor package.

FIG. 9 is a schematic cross-sectional view illustrating an example of a fan-out semiconductor package.

Figure 10:
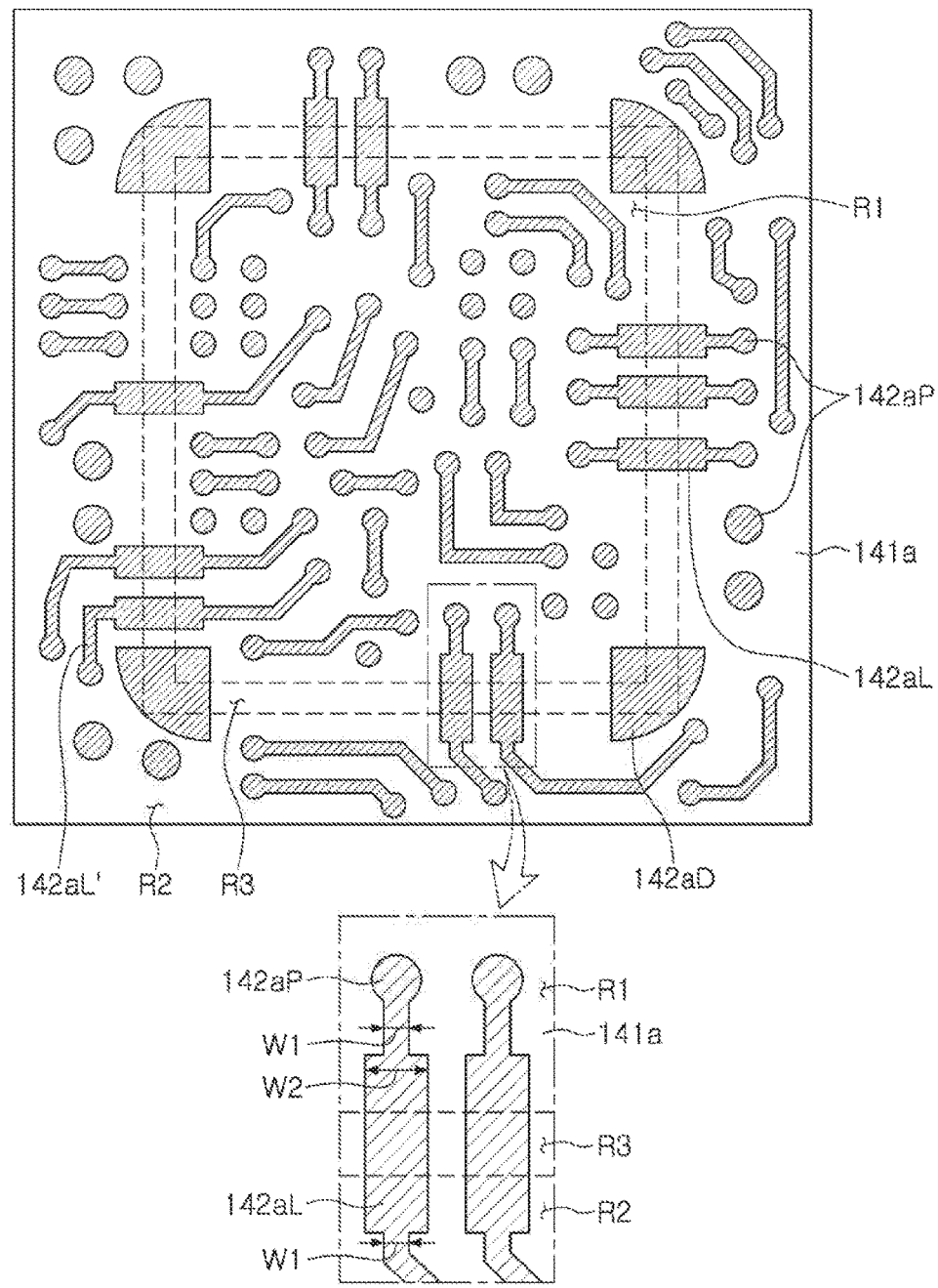
FIG. 10 is a schematic plan view illustrating a redistribution layer region of FIG. 9.

FIG. 10 is a schematic plan view illustrating a redistribution layer region of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, an encapsulant 130 encapsulating at least portions of the first connection member 110 and the semiconductor chip 120, a second connection member 140 disposed on the first connection member 110 and the active surface of the semiconductor chip 120, a passivation layer 150 disposed on the second connection member 140, an underbump metal layer 160 disposed in openings 151 of the passivation layer 150, and connection terminals 170 disposed on the passivation layer 150 and connected to the underbump metal layer 160. The second connection member 140 may include a first insulating layer 141a disposed on the first connection member 110 and the active surface of the semiconductor chip 120, a first redistribution layer 142a disposed on the first insulating layer 141a, a first via layer 143a connecting the first redistribution layer 142a and the connecting pads 122 of the semiconductor chip 120 to each other, a second insulating layer 141b disposed on the first insulating layer 141a, a second redistribution layer 142b disposed on the second insulating layer 141b, and a second via layer 143b penetrating through the second insulating layer 141b and connecting the first and second redistribution layers 142a and 142b to each other.

Meanwhile, recently, semiconductor packages used in mobile application products have been required to have high density, a miniature size, and a multi-function. Therefore, in accordance with gradual multi-functionalization of semiconductors, the number of required pins has increased, and sizes of the semiconductor packages have thus increased. Therefore, a semiconductor package in accord with a trend toward slimness and lightness of products such as a mobile device, a wearable device, or the like, has been demanded. Technology developed in order to satisfy such a demand is a wafer level package. The wafer level package is technology for directly mounting a chip on a wafer, and innovation such as a reduction in a thickness and a volume of a semiconductor has become possible through the wafer level package. However, an existing wafer level package has a fan-in form, such that there is a limitation in using the existing wafer level package in a chip having many input/output (I/O) terminals. Therefore, a fan-out wafer level package has been prominent as new technology.

Meanwhile, the main issue in the fan-out wafer level package technology that has been recently prominent is to improve board level reliability, for example, reliability in a temperature cycle on board (TCoB) test, a drop test, or the like. Therefore, several attempts to secure the board level reliability of the fan-out semiconductor package have been conducted. As an example of these attempts, there may be a method of changing a shape of ball pads of a redistribution layer, or the like. However, in this case, there is a problem that board level reliability of the fan-out semiconductor package in a case of forming a redistribution layer having a complicated structure including a fan-in region and a fan-out region is not effectively improved.

On the other hand, in the fan-out semiconductor package 100A according to the exemplary embodiment, a reliability lifespan may be increased by partially increasing line widths of line patterns 142aL of the redistribution layer 142a of the second connection member 140 going through regions to which large stress is applied in an environment in which the board level reliability is problematic. In detail, in one plane region in which the redistribution layer 142a of the second connection member 140 is formed, when the fan-out semiconductor package 100A is projected in a direction perpendicular to the active surface of the semiconductor chip 120, a projected surface of the semiconductor chip 120 is a fan-in region and a region surrounding the fan-in region is a fan-out region, line widths of the line pattern 142aL may be designed to be increased when the line pattern 142aL at least passes through a boundary between the fan-in region and the fan-out region. That is, the redistribution layer 142a may include the line pattern 142aL including first line portions having a first line width W1 and a second line portion connected to the first line portion and having a second line width W2 greater than the first line width W1. In this case, the second line portion of the line pattern 142aL may at least pass through the boundary between the fan-in region and the fan-out region. In more detail, in one plane region in which the redistribution layer 142a of the second connection member 140 is formed, when the fan-out semiconductor package 100A is projected in the direction perpendicular to the active surface of the semiconductor chip 120, if the projected surface of the semiconductor chip 120 is R1, a projected surface of the first connection member 110 is R2, and a projected surface of a portion of the through-hole 110H between the semiconductor chip 120 and the first connection member 110 is R3, line widths of the line pattern 142aL passing through a region R3 and then going through regions R1 and R2 in the redistribution layer 142a may be designed to be increased when the line pattern 142aL passes through region R3. That is, the redistribution layer 142a may include the line pattern 142aL including the first line portion having the first line width W1 and the second line portion connected to the first line portion and having the second line width W2 greater than the first line width W1, and at least portions of the second line portion of the line pattern 142aL may overlap region R3. Therefore, even in a case of forming the redistribution layer 142a having a complicated structure including the fan-in region and the fan-out region, board level reliability of the fan-out semiconductor package may be effectively improved. Meanwhile, although not illustrated in detail in the drawings, line patterns 142aL, or the like, may be similarly introduced into the redistribution layer 142b. These line patterns 142aL, or the like, may be introduced into both of the redistribution layers 142a and 142b.

Meanwhile, in a case in which the line pattern 142aL such as electrical signal lines or power lines passes through corner portions of region R3 to which the large stress is applied in the environment in which the board level reliability is problematic, even though the line pattern 142aL of which the line widths W1 and W2 are designed as described above passes through the corner portions of region R3, a reliability lifespan may be significantly reduced. Therefore, in the fan-out semiconductor package 100A according to the exemplary embodiment, dummy patterns 142aD disconnected from the line pattern 142aL may be disposed in corner portions of the fan-in region, more specifically, the corner portions of region R3. The dummy patterns 142aD may be electrically floating patterns. Each of the dummy patterns 142aD may be electrically isolated from any of the remaining patterns of the redistribution layers 142a and 142b, and may not be used to provide any signal or power to the semiconductor chip or to the remaining patterns of the redistribution layers 142a and 142b. The present disclosure is not limited thereto. For example, the dummy patterns 142aD may be electrically connected to a ground (GND) patterns. The dummy patterns 142aD may have a width, defined along a boundary between regions R1 and R3 or between regions R2 and R3, greater than the line width W2. The dummy patterns 142aD may extend up to corner portions of region R1 and portions of region R2 adjacent to the corner portions of region R3. The dummy patterns 142aD may be more robust to stress than the line pattern 142aL due to a metal ratio higher than that of the line pattern 142aL, or the like. Meanwhile, line patterns 142aL' designed to pass through the corresponding portions among the line pattern 142aL may be disposed to bypass a region occupied by the dummy patterns 142aD disposed at the corner portions of the fan-in region, more specifically, the corner portions of region R3. Therefore, an influence of the stress applied to the corresponding region on the line pattern 142aL' may be significantly reduced. Meanwhile, although not illustrated in detail in the drawings, line patterns 142aL, dummy patterns 142aD, or the like, may be similarly introduced into the redistribution layer 142b. These line patterns 142aL, dummy patterns 142aD, or the like, may be introduced into both of the redistribution layers 142a and 142b.

The respective components included in the fan-out semiconductor package 100A according to the exemplary embodiment will hereinafter be described in more detail.

The first connection member 110 may improve rigidity of the fan-out sensor package 100A depending on certain materials, and serve to secure uniformity of a thickness of the encapsulant 130. When through-wirings, or the like, are formed in the first connection member 110, the fan-out semiconductor package 100A may be utilized as a package-on-package (POP) type package. The first connection member 110 may have the through-hole 110H. The semiconductor chip 120 may be disposed in the through-hole 110H to be spaced apart from the first connection member 110 by a predetermined distance. Side surfaces of the semiconductor chip 120 may be surrounded by the first connection member 110. However, such a form is only an example and may be variously modified to have other forms, and the first connection member 110 may perform another function depending on such a form. The first connection member 110 may be omitted, if necessary, but it may be more advantageous in securing the board level reliability intended in the present disclosure that the fan-out semiconductor package 100A includes the first connection member 110.

The first connection member 110 may include an insulating layer 111. An insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. If necessary, a redistribution layer (not illustrated) may be further formed on the active surface of the semiconductor chip 120, and bumps (not illustrated), or the like, may be connected to the connection pads 122.

The encapsulant 130 may protect the first connection member 110, the semiconductor chip 120, and the like. An encapsulation form of the encapsulant 130 is not particularly limited, but may be a form in which the encapsulant 130 surrounds at least portions of the first connection member 110, the semiconductor chip 120, and the like. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The second connection member 140 may redistribute the connection pads 122 of the semiconductor chip 120. Several tens to several hundreds of connection pads 122 of the semiconductor chip 120 having various functions may be redistributed by the second connection member 140, and may be physically or electrically connected to an external source through the connection terminals 170 depending on the functions. The second connection member 140 may include the first insulating layer 141a disposed on the first connection member 110 and the active surface of the semiconductor chip 120, the first redistribution layer 142a disposed on the first insulating layer 141a, the first via layer 143 connecting the first redistribution layer 142a and the connecting pads 122 of the semiconductor chip 120 to each other, the second insulating layer 141b disposed on the first insulating layer 141a, the second redistribution layer 142b disposed on the second insulating layer 141b, and the second via layer 143b penetrating through the second insulating layer 141b and connecting the first and second redistribution layers 142a and 142b to each other. The first and second redistribution layers 142a and 142b may be electrically connected to the connection pads 122 of the semiconductor chip 120.

An insulating material may be used as a material of each of the insulating layers 141a and 141b. In this case, a photosensitive insulating material such as a PID resin may also be used as the insulating material. That is, the insulating layers 141a and 141b may be photosensitive insulating layers. When the insulating layers 141a and 141b has photosensitive properties, the insulating layers 141a and 141b may be formed to have a smaller thickness, and fine pitches of the via layers 143a and 143b may be achieved more easily. The insulating layers 141a and 141b may be photosensitive insulating layers including an insulating resin and an inorganic filler. When the insulating layers 141a and 141b are multiple layers, the materials of the insulating layers 141a and 141b may be the same as each other, and may also be different from each other, if necessary. When the insulating layers 141a and 141b are the multiple layers, the insulating layers 141a and 141b may be integrated with each other depending on a process, such that a boundary therebetween may also not be apparent.

The redistribution layers 142a and 142b may serve to substantially redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may perform various functions depending on designs of their corresponding layers. For example, the redistribution layers 142a and 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a and 142b may include via pad patterns, connection terminal pad patterns, and the like.

In one plane region in which the redistribution layer 142a of the second connection member 140 is formed, when projected in the direction perpendicular to the active surface of the semiconductor chip 120, if the projected surface of the semiconductor chip 120 is the fan-in region and the region surrounding the fan-in region is the fan-out region, the redistribution layer 142a may include the line pattern 142aL of which the line widths are increased when the line pattern 142aL at least passes through the boundary between the fan-in region and the fan-out region. For example, the redistribution layer 142a may include the line pattern 142aL including the first line portion having the first line width W1 and the second line portion having the second line width W2 greater than the first line width W1. In this case, the second line portion of the line pattern 142aL may at least pass through the boundary between the fan-in region and the fan-out region. In other words, a line width of the line pattern 142aL may be changed from the line width of the first line portion to the line width of the second line portion before the line pattern 142aL passes through the boundary between the fan-in region and the fan-out region, and may be again changed from the line width of the second line portion to the line width of the first line portion after the line pattern 142aL passes through the boundary between the fan-in region and the fan-out region.

In more detail, in one plane region in which the redistribution layer 142a of the second connection member 140 is formed, when the fan-out semiconductor package 100A is projected in the direction perpendicular to the active surface of the semiconductor chip 120, if the projected surface of the semiconductor chip 120 is R1, the projected surface of the first connection member 110 is R2, and the projected surface of a portion of the through-hole 110H between the semiconductor chip 120 and the first connection member 110 is R3, the line widths of the line pattern 142aL passing through region R3 and then going through regions R1 and R2 in the redistribution layer 142a may be increased when the line pattern 142aL passes through region R3. For example, the redistribution layer 142a may include the line pattern 142aL including the first line portion having the first line width W1 and the second line portion having the second line width W2 greater than the first line width W1, and at least portions of the second line portion of the line pattern 142aL may overlap region R3. Therefore, even in the case of forming the redistribution layer 142a having the complicated structure including the fan-in region and the fan-out region, the board level reliability of the fan-out semiconductor package may be effectively improved. Portions of the second line portion may be disposed in region R3, and the first line portion and the other portions of the second line portion connected to the first line portion may be disposed in regions R1 and R2. The line pattern 142aL may be signal lines or power lines, depending on a design. The respective line patterns 142aL may be connected to the respective pad patterns 142aP which may act as landing pads that respective vias, for example, the first vias 143a and/or the second vias 143b, are formed on. One integral pattern of the first redistribution layer 141a may include first and second pad patterns 142aP formed at opposite ends of the one integral pattern and having a line pattern 142aL connecting the first and second pad patterns 142aP to each other. The line pattern 142aL of the one integral pattern having a width increasing first and then decreasing along a direction from the first pad pattern 142aP to the second pad pattern 142aP.

An intermediate portion of the line pattern 142aP having a maximum width may cross the boundary between the regions R1 and R3 and the boundary between the regions R2 and R3. A width of the first and second pad patterns 142aP may be greater than that of the other portions of the line pattern 142aP connecting the intermediate portion thereof to the first and second pad patterns 142aP. In a case in which the first and second pad patterns 142aP have a circular shape, a diameter of the circular shape may be greater than a width W1 of the other portions of the line pattern 142aP connecting the intermediate portion thereof to the first and second pad patterns 142aP, and the diameter of the circular shape may be less than the width W2 of the intermediate portion crossing the cross the boundary between the regions R1 and R3 and the boundary between the regions R2 and R3. No via may be formed directly on the intermediate portion crossing the boundary between the regions R1 and R3 having the width W2. Meanwhile, the line pattern 142aL, or the like, may be similarly introduced into the redistribution layer 142b. That is, the line pattern 142aL, or the like, may be introduced into both of the redistribution layers 142a and 142b.

In one plane region in which the redistribution layer 142a of the second connection member 140 is formed, the dummy patterns 142aD disconnected from the line pattern 142aL may be disposed at the corner portions of the fan-in region, more specifically, the corner portions of region R3. The dummy patterns 142aD may extend up to the corner portions of region R1 and the portions of region R2 adjacent to the corner portions of region R3. The dummy patterns 142aD may be more robust to stress than the line pattern 142aL due to a metal ratio higher than that of the line pattern 142aL, or the like. Meanwhile, the line pattern 142aL' designed to pass through the corresponding portions among the line pattern 142aL may be disposed to bypass a region occupied by the dummy patterns 142aD disposed at the corner portions of the fan-in region, more specifically, the corner portions of region R3. Therefore, an influence of the stress applied to the corresponding region on the line pattern 142aL' may be significantly reduced. The dummy patterns 142aD may be electrically insulated from the line pattern 142aL. Each of the dummy patterns 142aD may also be formed of a conductive material such as copper (Cu), aluminum (Al), silver (Ag), tin (Sn), gold (Au), nickel (Ni), lead (Pb), titanium (Ti), or alloys thereof. Shapes of the dummy patterns 142aD are not particularly limited, but may be several shapes such as a solid pattern shape, a hole pattern shape, and the like. Meanwhile, although not illustrated in detail in the drawings, the line pattern 142aL, the dummy patterns 142aD, or the like, may be similarly introduced into the redistribution layer 142b. These line patterns 142aL, dummy patterns 142aD, or the like, may be introduced into both of the redistribution layers 142a and 142b.

The via layers 143a and 143b may electrically connect the redistribution layers 142a and 142b, the connection pads 122, or the like, formed on different layers to each other, resulting in an electrical path in the fan-out semiconductor package 100A. A material of each of the via layers 143a and 143b may be a conductive material such as copper (Cu), aluminum (Al), silver (Ag), tin (Sn), gold (Au), nickel (Ni), lead (Pb), titanium (Ti), or alloys thereof. Each of the via layers 143a and 143b may be completely filled with the conductive material, or the conductive material may also be formed along a wall of each of the vias. In addition, each of the via layers 143a and 143b may have all of the shapes known in the related art, such as a tapered shape, a cylindrical shape, and the like.

The passivation layer 150 may protect the second connection member 140 from external physical or chemical damage. The passivation layer 150 may have the openings 151 exposing at least portions of the redistribution layer 142b of the second connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 160 may improve connection reliability of the connection terminals 170 to improve board level reliability of the fan-out semiconductor package 100A. The underbump metal layer 160 may be connected to the redistribution layer 142b of the second connection member 140 exposed through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on a wall of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounted technology (SMT) component including an inductor, a capacitor, or the like, may be disposed on a surface of the passivation layer 150, if necessary.

Figure 11:
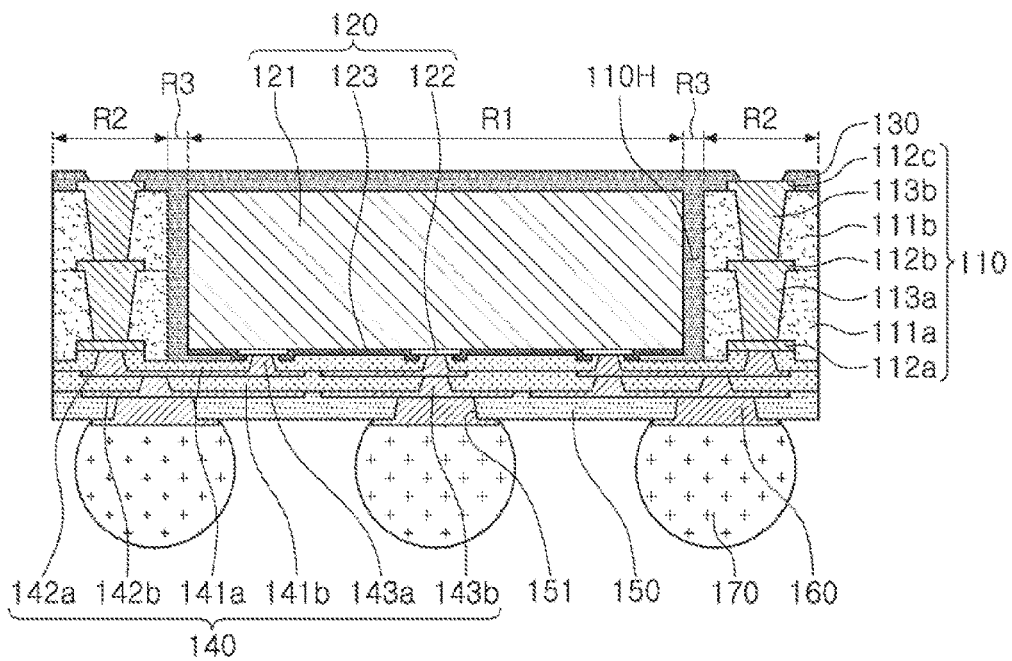
FIG. 11 is a schematic cross-sectional view illustrating another example of a fan-out semiconductor package.

FIG. 11 is a schematic cross-sectional view illustrating another example of a fan-out semiconductor package.

Referring to the drawing, in a fan-out semiconductor package 100B according to another exemplary embodiment in the present disclosure, a first connection member 110 may include a first insulating layer 111a in contact with a second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other through first and second vias 113a and 113b penetrating through the first and second insulating layers 111a and 111b, respectively.

When the first redistribution layer 112a is embedded in the first insulating layer 111a, a step generated due to a thickness of the first redistribution layer 112a may be significantly reduced, and an insulating distance of the second connection member 140 may thus become constant. That is, a difference between a distance from a first redistribution layer 142a of the second connection member 140 to a lower surface of the first insulating layer 111a and a distance from the first redistribution layer 142a of the second connection member 140 to the connection pad 122 of a semiconductor chip 120 may be lower than a thickness of the first redistribution layer 112a. Therefore, a high density wiring design of the second connection member 140 may be easy.

A lower surface of the first redistribution layer 112a of the first connection member 110 may be disposed on a level above a lower surface of the connection pad 122 of the semiconductor chip 120. In addition, a distance between the first redistribution layer 142a of the second connection member 140 and the first redistribution layer 112a of the first connection member 110 may be greater than that between the first redistribution layer 142a of the second connection member 140 and the connection pad 122 of the semiconductor chip 120. Here, the first redistribution layer 112a may be recessed into the insulating layer 111. As described above, when the first redistribution layer 112a is recessed into the first insulating layer 111a, such that the lower surface of the first insulating layer 111a and the lower surface of the first redistribution layer 112a have a step therebetween, a phenomenon in which a material of the encapsulant 130 bleeds to pollute the first redistribution layer 112a may be prevented. The second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the second redistribution layer 112b formed in the first connection member 110 may be disposed on the level between the active surface and the inactive surface of the semiconductor chip 120.

Thicknesses of the redistribution layers 112a, 112b, and 112c of the first connection member 110 may be greater than those of the redistribution layers 142a and 142b of the second connection member 140. Since the first connection member 110 may have a thickness equal to or greater than that of the semiconductor chip 120, the redistribution layers 112a, 112b, and 112c may be formed at large sizes depending on a scale of the first connection member 110. On the other hand, the redistribution layers 142a and 142b of the second connection member 140 may be formed at sizes relatively smaller than those of the redistribution layers 112a, 112b, and 112c for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The redistribution layers 112a, 112b, and 112c may serve to redistribute the connection pads 122 of the semiconductor chip 120. A material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of their corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include via pads, wire pads, connection terminal pads, and the like.

The vias 113a and 113b may electrically connect the redistribution layers 112a, 112b, and 112c formed on different layers to each other, resulting in an electrical path in the first connection member 110. A material of each of the vias 113a and 113b may be a conductive material. Each of the vias 113a and 113b may be completely filled with the conductive material, or the conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first redistribution layer 112a may serve as a stopper, and it may thus be advantageous in a process that each of the first vias 113a has the tapered shape of which a width of an upper surface is greater than that of a lower surface. In this case, the first vias 113a may be integrated with the pad patterns of the second redistribution layer 112b. In addition, when holes for the second vias 113b are formed, some of the pads of the second redistribution layer 112b may serve as a stopper, and it may thus be advantageous in a process that each of the second vias 113b has the tapered shape of which a width of an upper surface is greater than that of a lower surface. In this case, the second vias 113b may be integrated with the pad patterns of the third redistribution layer 112c.

A description, or the like, of other configurations except for the abovementioned configuration overlaps that described above, and is thus omitted.

Figure 12:
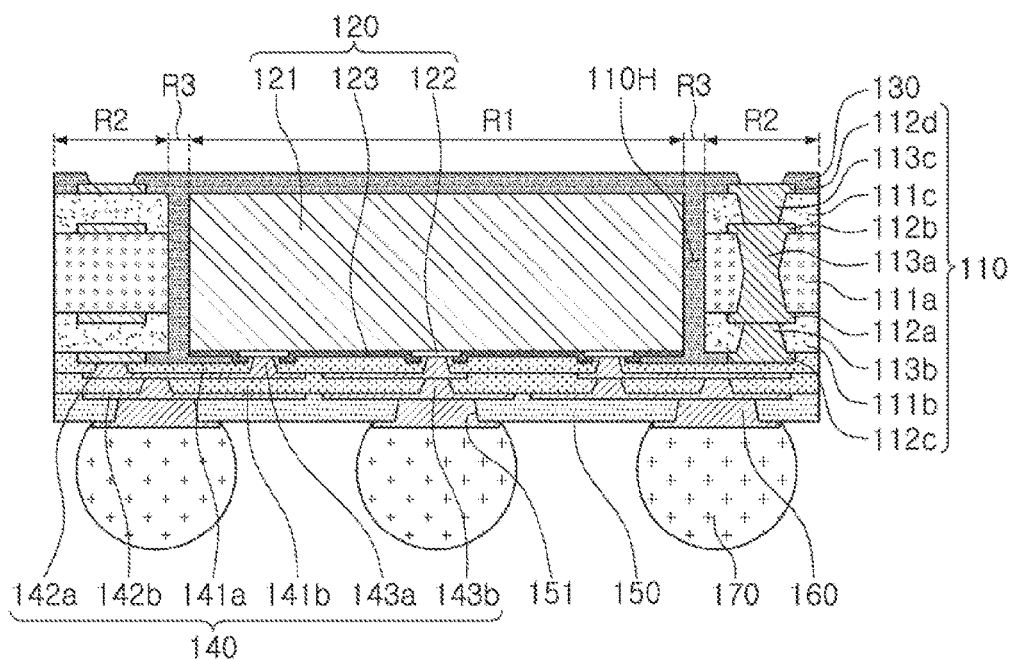
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100C according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, a second connection member 140 may be further simplified. Therefore, a decrease in a yield depending on a defect occurring in a process of forming the second connection member 140 may be suppressed. Meanwhile, the first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third redistribution layer 112c of the first connection member 110 may be disposed on a level below a lower surface of the connection pad 122 of a semiconductor chip 120. In addition, a distance between a first redistribution layer 142a of the second connection member 140 and the third redistribution layer 112c of the first connection member 110 may be smaller than that between the first redistribution layer 142a of the second connection member 140 and the connection pad 122 of the semiconductor chip 120. Here, the third redistribution layer 112c may be disposed in a protruding form on the second insulating layer 111b, resulting in being in contact with the second connection member 140. The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on the level between the active surface and the inactive surface of the semiconductor chip 120.

Thicknesses of the redistribution layers 112a, 112b, 112c, and 112d of the first connection member 110 may be greater than those of the redistribution layers 142a and 142b of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layers 142a and 142b of the second connection member 140 may be formed at relatively small sizes for thinness.

A description, or the like, of other configurations except for the abovementioned configuration overlaps that described above, and is thus omitted.

Figure 13:
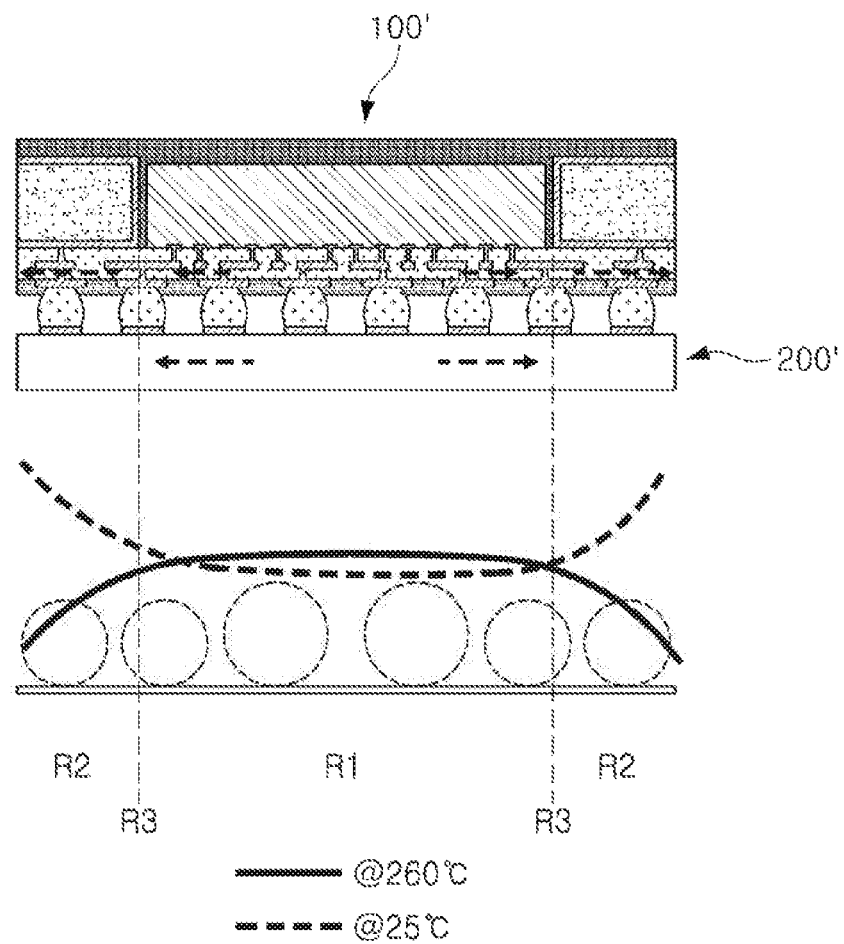
FIG. 13 is a schematic view illustrating board level warpage behavior of a fan-out semiconductor package.

FIG. 13 is a schematic view illustrating board level warpage behavior of a fan-out semiconductor package.

Referring to the drawing, it may be appreciated that when a fan-out semiconductor package 100' is mounted on a board 200', warpage behavior at high temperature and warpage behavior at room temperature are different from each other. Therefore, even in a case of forming a redistribution layer having a complicated structure including a fan-in region and a fan-out region, board level reliability of the fan-out semiconductor package may be problematic. Particularly, in a region R3 corresponding to a fixed region in a situation in which warpage behavior is periodically changed oppositely, the largest physical stress may be accumulated, and such a reliability problem may be largest in region R3 through which the redistribution layer passes when it goes through regions R1 and R2, as described above. However, in the fan-out semiconductor packages 100A, 100B, and 100C described above, such a board level reliability problem may be effectively solved through a design of the redistribution layer of region R3.

As set forth above, according to the exemplary embodiment in the present disclosure, a fan-out semiconductor package of which board level reliability is excellent may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a semiconductor chip having an active surface having connection pads disposed thereon and an inactive surface opposing the active surface;
   an encapsulant encapsulating at least portions of the semiconductor chip; and
   a first connection member disposed on the active surface of the semiconductor chip and including a redistribution layer electrically connected to the connection pads of the semiconductor chip,
   wherein the redistribution layer includes a line pattern having a first line portion having a first line width and a second line portion connected to the first line portion and having a second line width, greater than the first line width, and
   a fan-in region is a projected surface of the semiconductor chip projected in a direction perpendicular to the active surface, a fan-out region is a region surrounding the fan-in region, and the second line portion at least passes through a boundary between the fan-in region and the fan-out region.

2. The fan-out semiconductor package of claim 1, wherein the line pattern is changed from the first line width to the second line width before the line pattern passes through the boundary between the fan-in region and the fan-out region, and is changed from the second line width to the first line width after the line pattern passes through the boundary between the fan-in region and the fan-out region.

3. The fan-out semiconductor package of claim 1, further comprising dummy patterns disconnected from the line pattern disposed in corner portions of the fan-in region.

4. The fan-out semiconductor package of claim 3, wherein at least one of the line pattern bypasses a region occupied by the dummy patterns to pass through the boundary between the fan-in region and the fan-out region.

5. The fan-out semiconductor package of claim 1, wherein the first connection member includes a plurality of insulating layers and a plurality of redistribution layers disposed on the plurality of insulating layers, respectively, and
   each of the plurality of redistribution layers includes the line pattern.

6. The fan-out semiconductor package of claim 5, further comprising dummy patterns disconnected from the line pattern disposed in corner portions of the fan-in region of each of the plurality of redistribution layers.

7. A fan-out semiconductor package comprising:
   a first connection member having a through-hole;
   a semiconductor chip disposed in the through-hole of the first connection member and having an active surface having connection pads disposed thereon and an inactive surface opposing the active surface;
   an encapsulant encapsulating at least portions of the first connection member and the semiconductor chip; and
   a second connection member disposed on the first connection member and the active surface of the semiconductor chip and including a redistribution layer electrically connected to the connection pads of the semiconductor chip,
   wherein the redistribution layer includes a line pattern having a first line portion having a first line width and a second line portion connected to the first line portion and having a second line width, greater than the first line width,
   region R1 is a projected surface of the semiconductor chip projected in a direction perpendicular to the active surface of the semiconductor chip onto one plane region in which the redistribution layer of the second connection member is formed, region R2 is a projected surface of the first connection member projected in the direction perpendicular to the active surface of the semiconductor chip onto the one plane region, region R3 is a projected surface of a portion of the through-hole between the semiconductor chip and the second connection member projected in the direction perpendicular to the active surface of the semiconductor chip onto the one plane region, and at least portions of the second line portion of the line pattern overlap region R3.

8. The fan-out semiconductor package of claim 7, wherein at least portions of the second line portion are disposed in region R3, and the first line portion and the other portions of the second line portion connected to the first line portion are disposed in regions R1 and R2.

9. The fan-out semiconductor package of claim 7, further comprising dummy patterns disconnected from the line pattern disposed in corner portions of region R3.

10. The fan-out semiconductor package of claim 7, wherein the first connection member includes a first insulating layer, a first redistribution layer in contact with the second connection member and embedded in the first insulating layer, and a second redistribution layer disposed on the other surface of the first insulating layer opposing one surface of the first insulating layer in which the first redistribution layer is embedded, and the first and second redistribution layers are electrically connected to the connection pads.

11. The fan-out semiconductor package of claim 10, wherein the first connection member further includes a second insulating layer disposed on the first insulating layer and covering the second redistribution layer and a third redistribution layer disposed on the second insulating layer, and the third redistribution layer is electrically connected to the connection pads.

12. The fan-out semiconductor package of claim 10, wherein a lower surface of the first redistribution layer has a step with respect to a lower surface of the first insulating layer.

13. The fan-out semiconductor package of claim 7, wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and the first to third redistribution layers are electrically connected to the connection pads.

14. The fan-out semiconductor package of claim 13, wherein the first connection member further includes a third insulating layer disposed on the first insulating layer and covering the second redistribution layer and a fourth redistribution layer disposed on the third insulating layer, and the fourth redistribution layer is electrically connected to the connection pads.

15. The fan-out semiconductor package of claim 13, wherein the first insulating layer has a thickness greater than that of the second insulating layer.

16. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating at least portions of the first connection member and the semiconductor chip; and
a second connection member disposed on the first connection member and the active surface of the semiconductor chip and including a redistribution layer electrically connected to the connection pads of the semiconductor chip,
wherein the redistribution layer includes a pattern including first and second pad patterns constituting opposite ends of the pattern, a line pattern connecting the first and second pad patterns to each other,
region R1 is a projected surface of the semiconductor chip projected in a direction perpendicular to the active surface of the semiconductor chip onto one plane region in which the redistribution layer of the second connection member is formed, region R2 is a projected surface of the first connection member projected in the direction perpendicular to the active surface of the semiconductor chip onto the one plane region, region R3 is a projected surface of a portion of the through-hole between the semiconductor chip and the second connection member projected in the direction perpendicular to the active surface of the semiconductor chip onto the one plane region, and the line pattern includes an intermediate portion crossing a boundary between regions R1 and R3 and a boundary between regions R2 and R3, a first portion connecting the intermediate portion to first pad pattern, and a second portion connecting the intermediate portion to the second pad pattern, and
a width of the first portion is less than a width of the intermediate portion and a width of the first pad pattern, and a width of the second portion is less than a width of the intermediate portion and a width of the second pad pattern.

17. The fan-out semiconductor package of claim 16, wherein the redistribution layer further comprises dummy patterns disposed on corners of region R3,
wherein the dummy patterns are electrically isolated from all of the other portions of the redistribution layer.

18. The fan-out semiconductor package of claim 16, wherein a first via is formed directly on the first pad pattern and a second via is formed directly on the second pad pattern.

19. The fan-out semiconductor package of claim 16, comprising no via formed directly on the intermediate portion.

20. The fan-out semiconductor package of claim 16, wherein each width is defined in a direction perpendicular to a path of the pattern from the first pad pattern to the second pad pattern.

* * * * *